(12) United States Patent
Ku et al.

(10) Patent No.: US 8,391,419 B2
(45) Date of Patent: Mar. 5, 2013

(54) CIRCUIT FOR RECOVERING AN OUTPUT CLOCK FROM A SOURCE CLOCK

(75) Inventors: Jonathan Ku, San Jose, CA (US); Sen-Jung Wei, San Jose, CA (US)

(73) Assignee: Synaptics, Inc., Santa Clara, CA (US)

( * ) Notice: Subject to any disclaimer, the term of this patent is extended or adjusted under 35 U.S.C. 154(b) by 1206 days.

(21) Appl. No.: 12/077,241

(22) Filed: Mar. 17, 2008

(65) Prior Publication Data

US 2009/0232262 A1 Sep. 17, 2009

(51) Int. Cl.
*H04L 27/00* (2006.01)
*H04L 7/00* (2006.01)

(52) U.S. Cl. ........................................ 375/326; 375/355

(58) Field of Classification Search .................. 375/326, 375/355, 324, 322, 316, 354
See application file for complete search history.

(56) References Cited

U.S. PATENT DOCUMENTS

| | | | |
|---|---|---|---|
| 5,812,618 A * | 9/1998 | Muntz et al. ................... | 375/372 |
| 7,076,233 B2 * | 7/2006 | Iancu .............................. | 455/334 |
| 7,295,644 B1 | 11/2007 | Wu et al. | |
| 7,298,299 B1 | 11/2007 | Cheung et al. | |
| 2003/0085743 A1* | 5/2003 | Ullmann et al. ............... | 327/156 |
| 2006/0239393 A1* | 10/2006 | Lai et al. ........................ | 375/376 |
| 2007/0121661 A1* | 5/2007 | Ohta et al. ..................... | 370/412 |
| 2007/0189315 A1* | 8/2007 | Aoyanagi ....................... | 370/412 |

OTHER PUBLICATIONS

International Search Report and Written Opinion for PCT/US2009/037311, publication date May 22, 2009, Integrated Device Technology, Inc.
Transmittal of International Preliminary Report on Patentability with Written Opinion for PCT/US2009/037311, publication date Sep. 30, 2010, Integrated Device Technology, Inc.

* cited by examiner

*Primary Examiner* — David C. Payne
*Assistant Examiner* — Brian J Stevens
(74) *Attorney, Agent, or Firm* — Roeder & Broder LLP; James P. Broder

(57) ABSTRACT

An output clock recovery circuit (10) for recovering an output clock (14) from a source clock (12) and time stamp information (18A, 18B) includes a time stamp translator (22) and a phase-locked loop circuit (17) including a fraction processor (34). The time stamp translator (22) receives the time stamp information (18A, 18B) and uses an algorithm that translates the time stamp information (18A, 18B) into a time stamp decimal component (48) and a time stamp integer component (50). The time stamp decimal component (48) is less than one and is processed by the fraction processor (34). The time stamp integer component (50) is maintained within a predetermined range of integers that are greater than zero. The output of the fraction processor (34) and the time stamp integer component (50) can be input into a feedback divider (36) of a feedback loop of the phase-locked loop circuit (17) to recover the output clock (14). The fraction processor (34) can include a fraction accumulator or a delta-sigma type of fractional-N phase-locked loop circuit.

38 Claims, 4 Drawing Sheets

Fig. 3A

| Std. | Resolution | LS Clk(Mhz) | LS/10 | STR Clk(Mhz) | N Divider | M Divider | M (Integer) | M/N*10 | M/N*10(Frac 20-bit) | R = M/N *10*10 | Threshold | P | M= M/N*10*P |
|---|---|---|---|---|---|---|---|---|---|---|---|---|---|
| VGA | 640x480 | 270 | 27.00 | 25.175 | 32768 | 3055.313 | 3055 | 0.93240741 | 0.932407 | 9.32407 | | 8 | 7.459256 |
| | | 270 | 27.00 | 31.500 | 32768 | 3822.933 | 3822 | 1.16666667 | 1.166666 | 11.66666 | | 8 | 9.333328 |
| | | 270 | 27.00 | 31.500 | 32768 | 3822.933 | 3822 | 1.16666667 | 1.666666 | 16.66666 | | 8 | 13.333328 |
| SVGA | 800x600 | 270 | 27.00 | 36.000 | 32768 | 4369.067 | 4369 | 1.33333333 | 1.333333 | 13.33333 | | 8 | 10.666664 |
| | | 270 | 27.00 | 36.000 | 32768 | 4369.067 | 4369 | 1.33333333 | 1.333333 | 13.33333 | | 8 | 10.666664 |
| | | 270 | 27.00 | 40.000 | 32768 | 4854.519 | 4854 | 1.48148148 | 1.481481 | 14.81481 | | 8 | 11.851848 |
| XGA | 1024x768 | 270 | 27.00 | 50.000 | 32768 | 6068.148 | 6068 | 1.85185185 | 1.851851 | 18.51851 | 16 | 4 | 7.407404 |
| | | 270 | 27.00 | 49.500 | 32768 | 6007.467 | 6007 | 1.83333333 | 1.833333 | 18.33333 | | 4 | 7.333332 |
| | | 270 | 27.00 | 56.250 | 32768 | 6826.667 | 6826 | 2.08333333 | 2.083333 | 20.83333 | | 4 | 8.333332 |
| | | 270 | 27.00 | 65.000 | 32768 | 7888.593 | 7888 | 2.40740741 | 2.407407 | 24.07407 | | 4 | 9.629628 |
| | | 270 | 27.00 | 75.000 | 32768 | 9102.222 | 9102 | 2.77777778 | 2.777777 | 27.77777 | | 4 | 11.111108 |
| | | 270 | 27.00 | 78.750 | 32768 | 9557.333 | 9557 | 2.91666667 | 2.916666 | 29.16666 | | 4 | 11.666664 |
| | | 270 | 27.00 | 85.500 | 32768 | 10376.533 | 10376 | 3.16666667 | 3.166666 | 31.66666 | | 4 | 12.666664 |
| | | 270 | 27.00 | 94.500 | 32768 | 11468.800 | 11468 | 3.5 | 3.5 | 35 | 32 | 2 | 7 |
| | | 270 | 27.00 | 108.000 | 32768 | 13107.200 | 13107 | 4 | 4 | 40 | | 2 | 8 |
| | | 270 | 27.00 | 135.000 | 32768 | 16384.000 | 16384 | 5 | 5 | 50 | | 2 | 10 |
| SXGA | 1280x1024 | 270 | 27.00 | 157.500 | 32768 | 19114.667 | 19114 | 5.83333333 | 5.833333 | 58.33333 | | 2 | 11.666666 |
| UXGA | 1600x1200 | 270 | 27.00 | 162.000 | 32768 | 19660.800 | 19660 | 6 | 6 | 60 | | 2 | 12 |
| | | 270 | 27.00 | 175.500 | 32768 | 21299.200 | 21299 | 6.5 | 6.5 | 65 | 64 | 1 | 6.5 |
| | | 270 | 27.00 | 189.000 | 32768 | 22937.600 | 22937 | 7 | 7 | 70 | | 1 | 7 |
| | | 270 | 27.00 | 202.500 | 32768 | 24576.000 | 24576 | 7.5 | 7.5 | 75 | | 1 | 7.5 |
| | | 270 | 27.00 | 229.500 | 32768 | 27852.800 | 27852 | 8.5 | 8.5 | 85 | | 1 | 8.5 |
| WQXGA | 2560x1600 | 270 | 27.00 | 268.250 | 32768 | 32555.615 | 32555 | 9.93518519 | 9.935185 | 99.35185 | | 1 | 9.935185 |
| TV | 480p | 270 | 27.00 | 27.000 | 32768 | 3276.800 | 3276 | 1 | 1 | 10 | 16 | 8 | 8 |
| | 576p | 270 | 27.00 | 27.000 | 32768 | 3276.800 | 3276 | 1 | 1 | 10 | | 8 | 8 |
| | 720p | 270 | 27.00 | 74.250 | 32768 | 9011.200 | 9011 | 2.75 | 2.75 | 27.5 | | 4 | 11 |
| | 1035i | 270 | 27.00 | 74.250 | 32768 | 9011.200 | 9011 | 2.75 | 2.75 | 27.5 | | 4 | 11 |
| | 1080i | 270 | 27.00 | 74.250 | 32768 | 9011.200 | 9011 | 2.75 | 2.75 | 27.5 | | 4 | 11 |
| | 1080p | 270 | 27.00 | 148.500 | 32768 | 18022.400 | 18022 | 5.5 | 2.75 | 55 | 32 | 2 | 11 |

Fig. 3B

| Std. | Resolution | LS Clk(Mhz) | LS/10 | STR Clk(Mhz) | N Divider | M Divider | M (Integer) | M/N*10 | M/N*10(20bit) | M/N *10 * 10 | Threshold | P | M= M/N*10*P |
|---|---|---|---|---|---|---|---|---|---|---|---|---|---|
| VGA | 640x480 | 162 | 16.20 | 25.175 | 32768 | 5092.188 | 5092 | 1.55401235 | 1.554012 | 15.54012 | 16 | 8 | 12.432096 |
| SVGA | 800x600 | 162 | 16.20 | 31.500 | 32768 | 6371.556 | 6371 | 1.94444444 | 1.944444 | 19.44444 | | 4 | 7.777776 |
| | | 162 | 16.20 | 31.500 | 32768 | 6371.556 | 6371 | 1.94444444 | 1.944444 | 19.44444 | | 4 | 7.777776 |
| | | 162 | 16.20 | 36.000 | 32768 | 7281.778 | 7281 | 2.22222222 | 2.222222 | 22.22222 | | 4 | 8.888888 |
| | | 162 | 16.20 | 36.000 | 32768 | 7281.778 | 7281 | 2.22222222 | 2.222222 | 22.22222 | | 4 | 8.888888 |
| | | 162 | 16.20 | 40.000 | 32768 | 8090.864 | 8090 | 2.4691358 | 2.469135 | 24.69135 | | 4 | 9.87654 |
| | | 162 | 16.20 | 50.000 | 32768 | 10113.580 | 10113 | 3.08641975 | 3.086419 | 30.86419 | | 4 | 12.345676 |
| | | 162 | 16.20 | 49.500 | 32768 | 10012.444 | 10012 | 3.05555556 | 3.055555 | 30.55555 | | 4 | 12.22222 |
| XGA | 1024x768 | 162 | 16.20 | 56.250 | 32768 | 11377.778 | 11377 | 3.47222222 | 3.472222 | 34.72222 | 32 | 2 | 6.944444 |
| | | 162 | 16.20 | 65.000 | 32768 | 13147.654 | 13147 | 4.01234568 | 4.012345 | 40.12345 | | 2 | 8.024691 |
| | | 162 | 16.20 | 75.000 | 32768 | 15170.370 | 15170 | 4.62962963 | 4.629629 | 46.29629 | | 2 | 9.259258 |
| | | 162 | 16.20 | 78.750 | 32768 | 15928.889 | 15928 | 4.86111111 | 4.861111 | 48.61111 | | 2 | 9.722222 |
| | | 162 | 16.20 | 85.500 | 32768 | 17294.222 | 17294 | 5.27777778 | 5.277777 | 52.77777 | | 2 | 10.555554 |
| | | 162 | 16.20 | 94.500 | 32768 | 19114.667 | 19114 | 5.83333333 | 5.833333 | 58.33333 | | 2 | 11.666666 |
| | | 162 | 16.20 | 108.000 | 32768 | 21845.333 | 21845 | 6.66666667 | 6.666666 | 66.66666 | 64 | 1 | 6.666666 |
| | | 162 | 16.20 | 135.000 | 32768 | 27306.667 | 27306 | 8.33333333 | 8.333333 | 83.33333 | | 1 | 8.333333 |
| SXGA | 1280x1024 | 162 | 16.20 | 157.500 | 32768 | 31857.778 | 31857 | 9.72222222 | 9.722222 | 97.22222 | | 1 | 9.722222 |
| UXGA | 1600x1200 | 162 | 16.20 | 162.000 | 32768 | 32768.000 | 32768 | 10 | 10 | 100 | | 1 | 10 |
| | | 162 | 16.20 | 175.500 | 32768 | 35498.667 | 35498 | 10.8333333 | 10.833333 | 108.3333333 | | 1 | 10.833333 |
| | | 162 | 16.20 | 189.000 | 32768 | 38229.333 | 38229 | 11.6666667 | 11.666666 | 116.6666667 | | 1 | 11.666666 |
| | | 162 | 16.20 | 202.500 | 32768 | 40960.000 | 40960 | 12.5 | 12.5 | 125 | | 1 | 12.5 |
| | | 162 | 16.20 | 229.500 | 32768 | 46421.333 | 46421 | 14.1666667 | 14.166666 | 141.6666667 | | 1 | 14.166666 |
| WQXGA | 2560x1600 | 162 | 18.20 | 268.250 | 32768 | 54259.358 | 54259 | 16.558842 | 16.558641 | 165.5864198 | | 1 | 16.558641 |
| TV | 480p | 162 | 16.20 | 27.000 | 32768 | 5461.333 | 5461 | 1.66666667 | 1.666666 | 16.66666 | 16 | 4 | 6.666664 |
| | 576p | 162 | 18.20 | 27.000 | 32768 | 5461.333 | 5461 | 1.66666667 | 1.666666 | 16.66666 | | 4 | 6.666664 |
| | 720p | 162 | 16.20 | 74.250 | 32768 | 15018.667 | 15018 | 4.58333333 | 4.583333 | 45.83333 | 32 | 2 | 9.166666 |
| | 1035i | 162 | 16.20 | 74.250 | 32768 | 15018.667 | 15018 | 4.58333333 | 4.583333 | 45.83333 | | 2 | 9.166666 |
| | 1080i | 162 | 16.20 | 74.250 | 32768 | 15018.667 | 15018 | 4.58333333 | 4.583333 | 45.83333 | | 2 | 9.166666 |
| | 1080p | 162 | 16.20 | 148.500 | 32768 | 30037.333 | 30037 | 9.16666667 | 9.166666 | 91.66666 | 64 | 1 | 9.166666 |

CIRCUIT FOR RECOVERING AN OUTPUT CLOCK FROM A SOURCE CLOCK

BACKGROUND

Serial data communications are used to communicate data between various devices. Receiving and correctly decoding a stream of serial data requires the system, including a transmitting device and a receiving device, to be synchronized. Often, a source clock signal, e.g., a Link Symbol Clock with a frequency of either 162 MHz ("reduced bit rate") or 270 MHz ("high bit rate"), and time stamp information (also referred to herein as "M" and "N"), are included in a stream of serial data transmitted to the receiving device. In these types of systems, an output clock such as a stream clock (also sometimes referred to as a "pixel clock") having an output frequency that is different than the source clock frequency, e.g., within the range of between 25.175 MHz (such as VGA) and 268.5 MHz (such as WQXGA) at the receiving device must be accurately recovered to increase proper functioning of the system. In certain systems, the time stamp information is 24-bit information is embedded in a data stream from the transmitting device, and relates to the relative frequencies between the source clock and the output clock.

However, because of the frequency disparity between the source clock and the output clock, accurate output clock recovery, also sometimes referred to herein as stream clock recovery ("SCR"), can be difficult with conventional systems. In some systems, the receiving device can perform clock data recovery techniques using a phase locked loop ("PLL"). The PLL analyzes the serial data stream and attempts to synchronize the receiving device with the transmitting device.

Unfortunately, it is a challenge to design a circuit with low-jitter performance that accurately recovers the stream clock since M and N values can be 24-bit values. These types of M and N values imply a typical design solution of an integer-N PLL based recovery circuit, which must have very low bandwidth, e.g., less than 1 Khz for a 270 MHz Link Symbol Clock in an asynchronous mode. Thus, one problem with this conventional type of circuit architecture is that it is rather complex and impractical to design sub-KHz bandwidth in a monolithic system-on-a-chip ("SOC") integrated circuit.

SUMMARY

The present invention is directed toward an output clock recovery circuit for recovering an output clock from a source clock and time stamp information. The source clock has a source clock frequency. The time stamp information is based on the source clock frequency and an output clock frequency of the output clock. In one embodiment, the output clock recovery circuit includes a phase-locked loop circuit including a fraction processor and a time stamp translator. The time stamp information includes a first time stamp component and a second time stamp component. The time stamp translator receives the time stamp information. Further, the time stamp translator uses an algorithm that translates the first time stamp component and the second time stamp component into a time stamp decimal component and a time stamp integer component. The time stamp decimal component is less than one and is processed by the fraction processor. The time stamp integer component is maintained within a predetermined range of integers that are greater than zero.

In one embodiment, a lower end of the predetermined range is greater than 3, and an upper end of the predetermined range is less than 20, although this range can vary. In one embodiment, the time stamp translator determines a value R, which equals the ratio of the output clock frequency to the source clock frequency times a constant. In some embodiments, the algorithm includes a multiplier P that varies depending upon the value of R. In one embodiment, the time stamp decimal component and the time stamp integer component are derived by multiplying P times R/10. In certain embodiments, P decreases as R incrementally increases. In one embodiment, the phase-locked loop circuit includes a voltage-controlled oscillator that generates an output signal that is divided by P to recover the output clock. In some embodiments, P is within the range of 1 to 8. The output of the fraction processor and the time stamp integer component can be input into a feedback divider of a feedback loop of the phase-locked loop circuit to recover the output clock. Further, the fraction processor can include a fraction accumulator type of fractional-N phase-locked loop circuit. Alternatively, the fraction processor includes a delta-sigma type of fractional-N phase-locked loop circuit.

The present invention is also directed toward a method for recovering an output clock from a source clock and time stamp information.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which:

FIG. 3A is a table illustrating a plurality of examples of translation of time stamp information by the time stamp translator as a function of source clock frequencies and output clock frequencies for various video modes; and FIG. 3B is a table illustrating a plurality of examples of translation of time stamp information by the time stamp translator as a function of source clock frequencies and output clock frequencies for additional video modes.

DESCRIPTION

An output clock recovery circuit 10 provided herein accurately recovers an output clock 14 from a source clock 12 having a similar or different frequency as that of the output clock 14. The present invention can apply to any cross-clock domain data transport system. Although the description provided herein focuses primarily on video systems, and in particular, stream clock recovery circuits, it is recognized that no limitation to video systems should be construed from the description herein. For example, the recovery circuit 10 disclosed and described herein can equally be useful for audio applications in which it is necessary to recover a variable audio clock sampling frequency in a receiving device based on a fixed source clock transmitter frequency. Additionally, any other suitable type of cross-clock domain data transport system can benefit from the technology disclosed and described herein.

Figure 1:
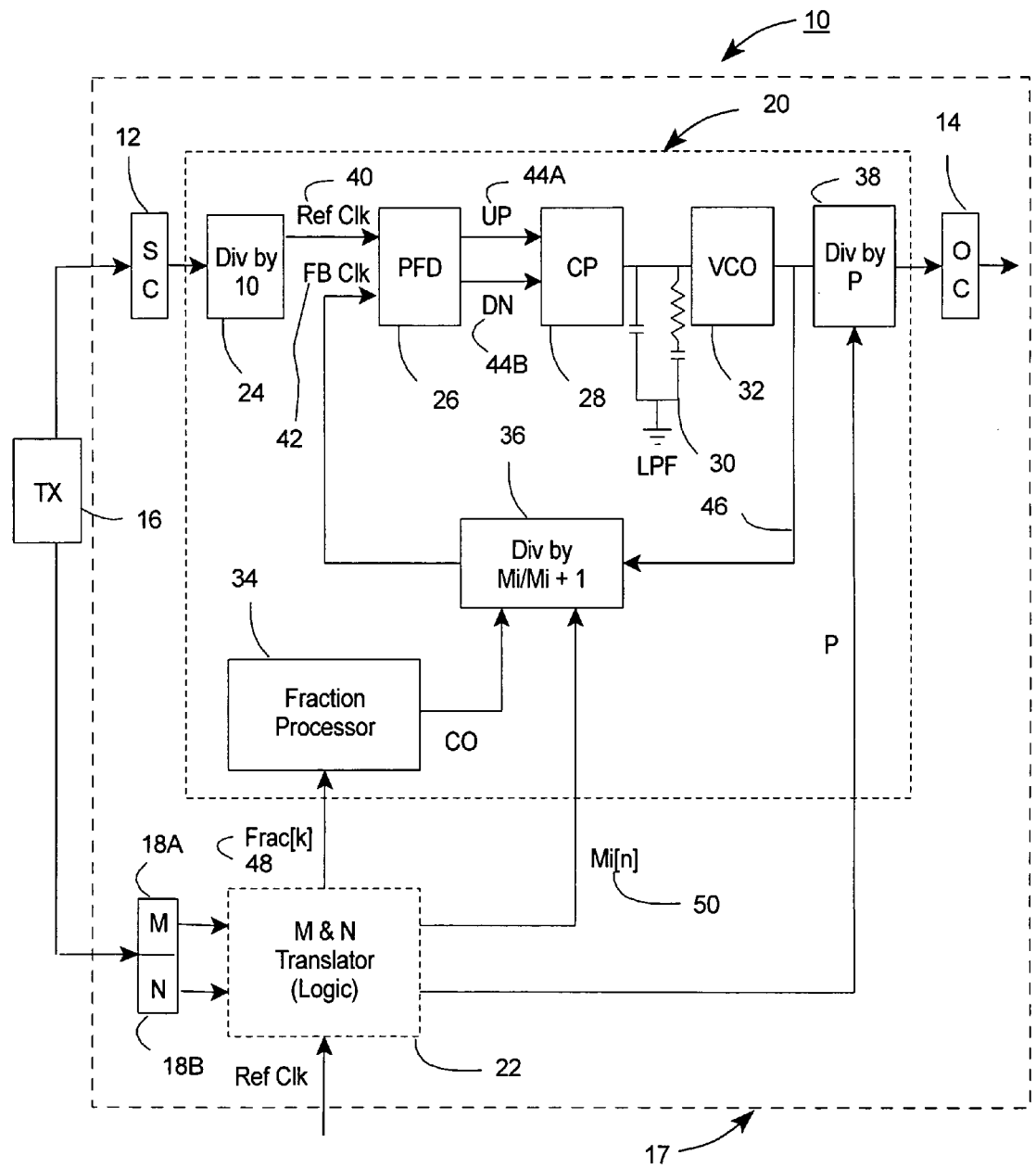
FIG. 1 is a schematic flow chart diagram illustrating one embodiment of an output clock recovery circuit having features of the present invention, including a time stamp translator.

FIG. 1 is a flow chart diagram that provides a schematic of one embodiment of the output clock recovery circuit 10. It is recognized that the specific architecture of the output clock recovery circuit 10 can be varied to suit the design requirements of the system. In the embodiment illustrated in FIG. 1, the source clock 12 is included in a data stream that originates from a transmitting device 16 (illustrated as "TX" in FIG. 1). The source clock 12 is first serialized and is subsequently recovered, i.e. deserialized, through clock and data recovery ("CDR") at a receiving device 17 (illustrated as an outer dashed-line rectangle in FIG. 1). For clarity in describing the present invention, deserialization of the source clock 12 is not illustrated in FIG. 1.

In addition, time stamp information includes a first time stamp component 18A and a second time stamp component 18B (also shown in FIG. 1 as "M" and "N", respectively). The first and second time stamp components 18A, 18B are also transmitted in the data stream from the transmitting device 16. In certain embodiments, the time stamp components 18A, 18B can be 24-bit data that are based on the relative frequencies of the source clock 12 and the output clock 14. It is understood that the time stamp components 18A, 18B can alternatively include information other than 24-bit data.

In the embodiment illustrated in FIG. 1, the output clock recovery circuit 10 includes a Phase-locked loop ("PLL") circuit 20 (illustrated as an inner dashed-line rectangle in FIG. 1) and a time stamp translator 22. In certain embodiments, the PLL circuit 20 is a fractional-N PLL circuit. Alternatively, another suitable type of PLL circuit 20 can be used. The specific design of the PLL circuit can be varied. In the embodiment illustrated in FIG. 1, the PLL circuit 20 includes one or more of a reference divider 24, a phase frequency detector 26 ("PFD"), a charge-pump circuit 28 ("CP"), a low-pass filter 30 ("LPF") or other type of filter, a voltage-controlled oscillator 32 ("VCO"), a fraction processor 34, a feedback divider 36 and an output divider 38. It is recognized that one or more of these structures can be omitted entirely from the output clock recovery circuit 10. Alternatively, the PLL circuit 20 can include additional or alternative somewhat similar structures without departing from the spirit or scope of the present invention.

The reference divider 24 reduces the frequency of the source clock 12 to generate a reference clock 40 (illustrated as "Ref Clk" in FIG. 1). For example, the frequency of the source clock 12 can be divided by some integer which yields a reference clock frequency of 16.2 MHz or 27.0 MHz in the example provided. In the embodiment illustrated in FIG. 1, for instance, the reference divider 24 divides the frequency of the source clock 12 by a factor of 10. The reference clock 40 and a feedback clock signal 42 (illustrated as "FB Clk" in FIG. 1) are then compared using the PFD 26.

The PFD 26 can have two outputs 44A, 44B (UP or DN, respectively) which instruct subsequent circuitry on how to adjust (upwards or downwards) to lock onto the required phase. The outputs 44A, 44B are fed to the CP 28, which can be an analog current switch that generates either a higher or a lower voltage signal to one or more capacitors of the LPF 30. The LPF 30 integrates the voltage signal to smooth it. This smoothed signal is then fed to the VCO 32. An output signal 46 from the VCO 32 is indirectly and cyclically fed back to the PFD 26 for comparison with the reference clock 40. As explained in greater detail below, the time stamp information that has been processed by the time stamp translator 22 is incorporated into this feedback cycle to more accurately recover the output clock 14, increase the VCO frequency of the PLL 20, and/or benefit the jitter performance of the circuit.

The first time stamp component 18A and the second time stamp component 18B are fed into the time stamp translator 22 for processing. The time stamp translator 22 includes an algorithm (set forth greater detail in FIG. 2) that translates the 24-bit (or other size value) time stamp components 18A, 18B into a time stamp decimal component 48 ("Frac[k]") and a time stamp integer component 50 ("Mi[n]"), which can be much more easily processed by the PLL 20, as explained below. In this embodiment, the time stamp decimal component 48 is a decimal value that is less than one, and the time stamp integer component 50 is an integer that is greater than zero.

The time stamp decimal component 48 is fed into the fraction processor 34 for processing. In one embodiment, the fraction processor 34 is a fraction accumulator in an accumulator fractional-N PLL circuit. Alternatively, the fraction processor 34 can be another type of fraction processor 34, such as a delta-sigma type of fraction processor 34, as one non-exclusive example. The fraction processor 34 performs a repetitious series of processing steps that result in an occasional carry-out ("CO") of an integer to the feedback divider 36, depending upon the value of the time stamp decimal component 48 fed into the fraction processor 34. For example, the closer the time stamp decimal component 48 is to a value of 1.0, the more often carry-out of an integer to the feedback divider 36 will occur from the fraction processor 34.

At the same time, the time stamp integer component 50 is input from the time stamp translator 22 into the feedback divider 36. The feedback divider 36 determines the magnitude of the divisor (Mi) or (Mi+1) for the frequency of the output signal 46 from the VCO 32 during the feedback loop depending upon the frequency of carry-out by the fraction processor 34. In one embodiment, the feedback divider 36 will divide the frequency of the output signal by a particular integer (Mi) or (Mi+1) at a particular ratio depending upon the output of the fraction processor 34 in order to satisfy the requirements of the PLL 20. Once the feedback divider 36 has processed the output signal 46, the new feedback clock signal 42 is compared with the reference clock 40 and the cycle is repeated.

Figure 2:
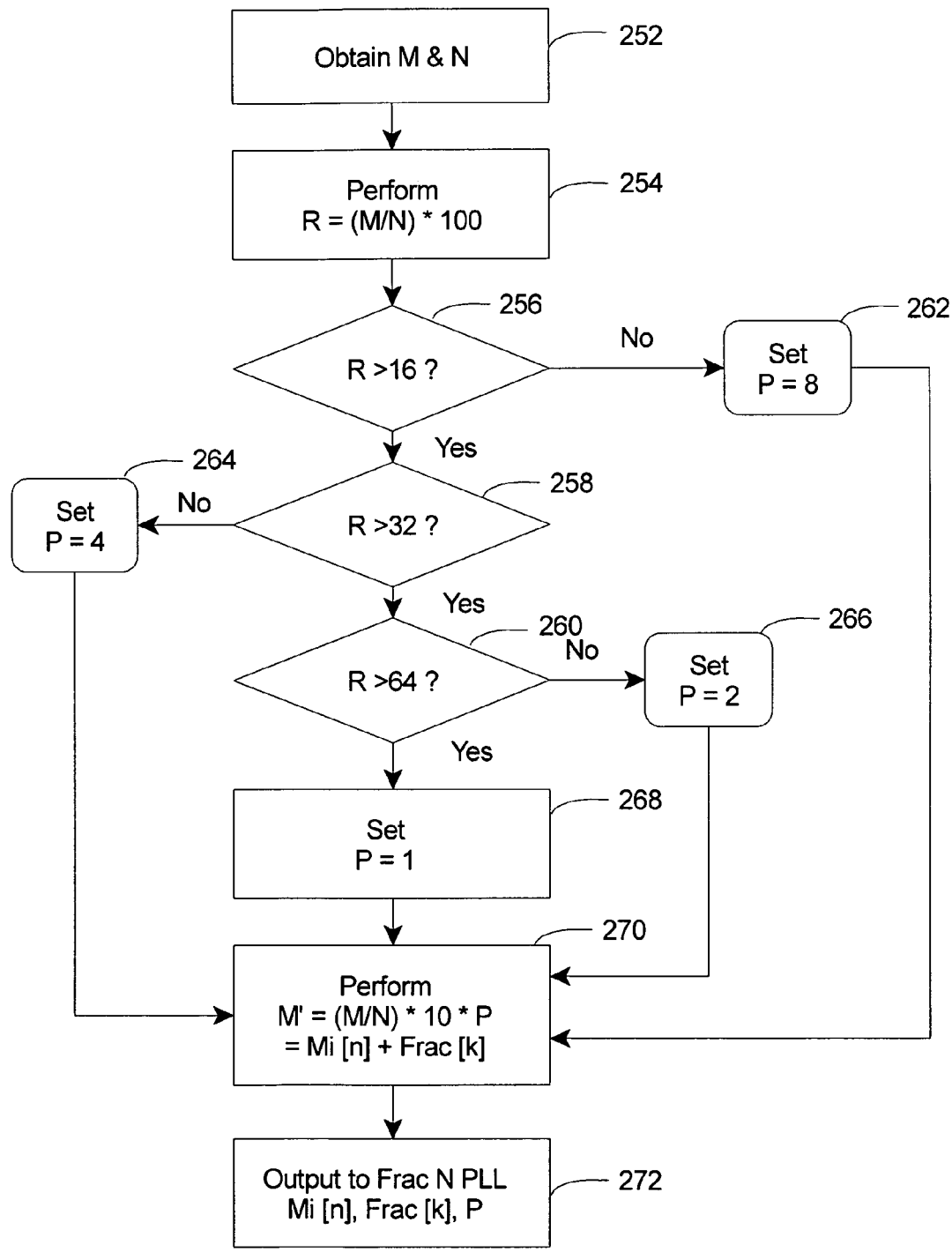
FIG. 2 is a schematic flow chart diagram illustrating one embodiment of the time stamp translator.

FIG. 2 is a schematic flow chart diagram illustrating one embodiment of an algorithm incorporated into the time stamp translator 22. At step 252, the first and second time stamp components are received from the transmitting device. At step 254, a mathematical formula is then applied to the time stamp components M and N to determine the time relationship between the source clock and the output clock:

$$R = (M/N) \times 100 \qquad [1]$$

The factor of 100 is used in this embodiment because in certain video modes, the ratio of M and N is much less than one. Having a multiplication factor of 100 increases the likelihood or ensures that R will be greater than one for all video modes. However, in other embodiments, another multiplication factor could be substituted for 100, such as any suitable constant that increases the likelihood or ensures that R will be greater than one.

Depending upon the resulting value of R, another value P is determined by the time stamp translator. In the embodiment illustrated in FIG. 2, a comparison of R versus various integers is performed (at steps 256, 258, 260). Depending upon whether R is greater than these integers (such as 16, 32 and 64, as illustrated in FIG. 2), a value of P is assigned (at steps 262, 264, 266, 268). In this embodiment, P can have a value of 8, 4, 2 or 1. However, in alternative embodiments, the value of P can vary from these particular values.

Once the value of P has been determined by the time stamp translator, a further mathematical formula is applied as follows, at step 270:

$$M' = (M/N) \times 10 \times P = Mi[n] + Frac[k] \qquad [2]$$

In this equation, the multiplier of 10 is derived from the reference divider 24 (illustrated in FIG. 1). Thus, if the reference divider 24 is set at a number different than 10, the multiplier in equation [2] would likewise be varied accordingly. Equation [2] utilized by the time stamp translator provides the time stamp decimal component Frac[k] and the time stamp integer component Mi[n] which are then input into the fractional accumulator and/or the feedback divider at step 272. Additionally, at step 272, the value of P is communicated to the output divider 38 so that the resulting signal can be divided by P to more accurately recover the output clock 14.

FIG. 3A is a table illustrating a plurality of examples of translation of time stamp information by the time stamp translator as a function of source clock frequencies and output clock frequencies for various video modes. In FIG. 3A, the various video modes include a source clock (indicated as "LS Clk") having a frequency of 270 MHz and an output clock (indicated as "STR Clk") having various different frequencies between 25.175 MHz and 268.25 MHz. In each case, the M and N time stamp components are 24-bit values. In one embodiment, the time stamp translator translates these time stamp components in accordance with the method set forth in FIG. 2 above. In this embodiment, the result is that although there is a large difference in the ratios of M and N time stamp components in these examples, the range of the resulting value of [(M/N)×10×P] is relatively small because the value of P is strategically varied. For example, the range of [(M/N)×10×P] for all of the examples in FIG. 3A is approximately between 6.5 and 13.4. Thus, the time stamp integer component would be within the range of 6 to 13.

FIG. 3B is a table illustrating a plurality of additional examples of translation of time stamp information by the time stamp translator as a function of source clock frequencies and output clock frequencies for various video modes. In FIG. 3B, the various video modes include a source clock (indicated as "LS Clk") having a frequency of 162 MHz and an output clock (indicated as "STR Clk") having various different frequencies between 25.175 MHz and 268.25 MHz. In each case, the M and N time stamp components are 24-bit values. In one embodiment, the time stamp translator translates these time stamp components in accordance with the method set forth in FIG. 2 above. In this embodiment, the result is that although there is a large difference in the ratios of M and N time stamp components in these examples, the range of the resulting value of [(M/N)×10×P] is relatively small because the value of P is strategically varied. For example, the range of [(M/N)×10×P] for all of the examples in FIG. 3B is approximately between 6.6 and 16.6. Thus, the time stamp integer component would be within the range of approximately 6 to 16. Thus, the VCO circuit can be more easily designed because of this reduced output range (approximately 2.6×) relative to a conventional output range such as 25.175 to 268.5, which is greater than 10×.

In an alternative embodiment, the range of [(M/N)×10×P] can be a predetermined range that is satisfied by altering the values of R and/or P in the method set forth in FIG. 2. For example, in non-exclusive alternative embodiments, the predetermined range can have a lower end of an integer greater than zero, 1, 2, 3, 4, 5, 6, 7, 8, 9 or 10. Further, the predetermined range can have an upper end of an integer less than 50, 40, 30, 25, 20, 19, 18, 17, 16, 15, 14, 13, 12, 11 or 10. Still alternatively, the lower end and/or upper end of these ranges can vary from those identified herein to suit the design requirements of the system.

While the particular output clock recovery circuit 10 as herein shown and disclosed in detail are fully capable of obtaining the objects and providing the advantages herein before stated, it is to be understood that they are merely illustrative of one or more embodiments and that no limitations are intended to the details of construction or design herein shown other than as described in the appended claims.

What is claimed is:

1. An output clock recovery circuit for recovering an output clock from (i) a source clock having a source clock frequency, and (ii) time stamp information that is based on the source clock frequency and an output clock frequency of the output clock, the time stamp information including a first time stamp component and a second time stamp component, the output clock recovery circuit comprising:
  a phase-locked loop circuit including a fraction processor; and
  a time stamp translator that receives the first time stamp component and the second time stamp component in a data stream, the time stamp translator being configured to translate the first time stamp component and the second time stamp component, the time stamp translator being configured to separately determine (i) a time stamp decimal component that is less than 1, the time stamp decimal component being processed by the fraction processor, and (ii) a time stamp integer component that is maintained within a predetermined range of integers that are greater than zero.

2. The output clock recovery circuit of claim 1 wherein a lower end of the predetermined range is greater than 3.

3. The output clock recovery circuit of claim 1 wherein an upper end of the predetermined range is less than 20.

4. The output clock recovery circuit of claim 3 wherein a lower end of the predetermined range is greater than 5.

5. The output clock recovery circuit of claim 1 wherein the time stamp translator determines a value R that is greater than zero, wherein R equals the ratio of the output clock frequency to the source clock frequency times a constant.

6. The output clock recovery circuit of claim 5 wherein time stamp translator includes an algorithm having a multiplier P that varies depending upon the value of R.

7. The output clock recovery circuit of claim 6 wherein the time stamp decimal component and the time stamp integer component are derived by multiplying P times R/10.

8. The output clock recovery circuit of claim 6 wherein P decreases as R incrementally increases.

9. The output clock recovery circuit of claim 6 wherein the phase-locked loop circuit includes a voltage-controlled oscillator that generates an output signal that is divided by P to recover the output clock.

10. The output clock recovery circuit of claim 6 wherein P is within the range of 1 to 8.

11. The output clock recovery circuit of claim 1 wherein the output of the fraction processor and the time stamp integer component are input into a feedback divider of a feedback loop of the phase-locked loop circuit to recover the output clock.

12. The output clock recovery circuit of claim 1 wherein the fraction processor includes a fraction accumulator type of fractional-N phase-locked loop circuit.

13. The output clock recovery circuit of claim 1 wherein the fraction processor includes a delta-sigma type of fractional-N phase-locked loop circuit.

14. A method for recovering an output clock from a source clock and time stamp information, the method comprising the steps of:
  inputting in a data stream a first time stamp component and a second time stamp component that are dependent upon a source clock frequency and an output clock frequency into a time stamp translator of an output clock recovery circuit;

translating the first time stamp component and a second time stamp component with the time stamp translator that is configured to separately determine (i) a time stamp decimal component that is less than 1, and (ii) a time stamp integer component that is maintained within a predetermined range of integers that are greater than zero; and processing the time stamp decimal component using a fraction processor of a phase-locked loop circuit.

15. The method of claim 14 wherein a lower end of the predetermined range is greater than 3.

16. The method of claim 14 wherein an upper end of the predetermined range is less than 20.

17. The method of claim 16 wherein a lower end of the predetermined range is greater than 5.

18. The method of claim 14 wherein the step of translating includes the time stamp translator determining a value R that is greater than zero, wherein R equals the ratio of the output clock frequency to the source clock frequency times a constant.

19. The method of claim 18 wherein the time stamp translator includes an algorithm having a multiplier P that varies depending upon the value of R.

20. The method of claim 19 wherein the step of translating includes deriving the time stamp decimal component and the time stamp integer component by multiplying P times R/10.

21. The method of claim 19 wherein P decreases as R incrementally increases.

22. The method of claim 19 further comprising the step of generating an output signal with a voltage-controlled oscillator of the phase-locked loop circuit, the output signal being divided by P to recover the output clock.

23. The method of claim 19 wherein P is within the range of 1 to 8.

24. The method of claim 14 further comprising the step of inputting the output of the fraction processor and the time stamp integer component into a feedback divider of a feedback loop of the phase-locked loop circuit to recover the output clock.

25. The method of claim 14 wherein the fraction processor includes a fraction accumulator type of fractional-N phase-locked loop circuit.

26. The method of claim 14 wherein the fraction processor includes a delta-sigma type of fractional-N phase-locked loop circuit.

27. An output clock recovery circuit for recovering an output clock from (i) a source clock having a source clock frequency, and (ii) time stamp information that is based on the source clock frequency and an output clock frequency of the output clock, the output clock recovery circuit comprising:

a phase-locked loop circuit including a fraction processor; and a time stamp translator that receives the time stamp information, the time stamp translator being configured to translate a first time stamp component and a second time stamp component into (i) a time stamp decimal component that is less than 1, the time stamp decimal component being processed by the fraction processor, and (ii) a time stamp integer component that is maintained within a predetermined range of integers that are greater than zero, and wherein the time stamp translator determines a value R, which equals the ratio of the output clock frequency to the source clock frequency times a constant.

28. The output clock recovery circuit of claim 27 wherein the time stamp translator includes an algorithm having a multiplier P that varies depending upon the value of R.

29. The output clock recovery circuit of claim 28 wherein the time stamp decimal component and the time stamp integer component are derived by multiplying P times R/10.

30. The output clock recovery circuit of claim 28 wherein P decreases as R incrementally increases.

31. The output clock recovery circuit of claim 28 wherein the phase-locked loop circuit includes a voltage-controlled oscillator that generates an output signal that is divided by P to recover the output clock.

32. The output clock recovery circuit of claim 28 wherein P is within the range of 1 to 8.

33. A method for recovering an output clock from a source clock and time stamp information, the method comprising the steps of:

inputting a first time stamp component and a second time stamp component that are dependent upon a source clock frequency and an output clock frequency into a time stamp translator of an output clock recovery circuit;

translating the first time stamp component and a second time stamp component into (i) a time stamp decimal component that is less than 1, and (ii) a time stamp integer component that is maintained within a predetermined range of integers that are greater than zero, and wherein the time stamp translator is configured to determine a value R, which equals the ratio of the output clock frequency to the source clock frequency times a constant; and processing the time stamp decimal component using a fraction processor of a phase-locked loop circuit.

34. The method of claim 33 wherein the time stamp translator includes an algorithm having a multiplier P that varies depending upon the value of R.

35. The method of claim 34 wherein the step of translating includes deriving the time stamp decimal component and the time stamp integer component by multiplying P times R/10.

36. The method of claim 34 wherein P decreases as R incrementally increases.

37. The method of claim 34 further comprising the step of generating an output signal with a voltage-controlled oscillator of the phase-locked loop circuit, the output signal being divided by P to recover the output dock.

38. The method of claim 34 wherein P is within the range of 1 to 8.

* * * * *